United States Patent

[11] 3,568,083

[72] Inventor Peter Harzer
Eningen Unter Achalm, Germany
[21] Appl. No. 770,001
[22] Filed Oct. 23, 1968
[45] Patented Mar. 2, 1971
[73] Assignee Wandel U. Goltermann Elektronische Prazisionsmessgerate
Reutlingen, Germany
[32] Priority Oct. 24, 1967
[33] Germany
[31] 1,591,819

[54] VARIABLE FREQUENCY GENERATOR WITH TIMER-CONTROLLED AUTOMATIC FREQUENCY CONTROL LOOP
7 Claims, 5 Drawing Figs.

[52] U.S. Cl. .......... 331/4, 331/14, 331/17, 331/18, 331/25
[51] Int. Cl. .......... H03b 3/04
[50] Field of Search .......... 331/1 (A), 4, 14, 17, 18, 25

[56] References Cited

UNITED STATES PATENTS

| | | | |
|---|---|---|---|
| 2,972,720 | 2/1961 | Hume | 331/4 |
| 3,221,266 | 11/1965 | Vitkovits, Jr. | 331/4X |
| 3,259,851 | 7/1966 | Brauer | 331/14 |
| 3,287,655 | 11/1966 | Venn et al. | 331/14 |

*Primary Examiner*—Roy Lake
*Assistant Examiner*—Siegfried H. Grimm
*Attorney*—Karl F. Ross

ABSTRACT: Decadic frequency generator wherein the output of an adjustable oscillator is evaluated in a digital frequency counter whose count, together with a signal from a manually settable digital frequency selector, is applied to a comparison circuit; in response to any disparity between the count and the selector signal, an analogue voltage is applied to a control circuit of the oscillator to effect a corrective adjustment.

Peter Harzer
INVENTOR.

BY Karl G. Ross
Attorney

Peter Harzer
INVENTOR.
BY Karl G. Ross
Attorney

VARIABLE FREQUENCY GENERATOR WITH TIMER-CONTROLLED AUTOMATIC FREQUENCY CONTROL LOOP

The present invention relates to a decadic frequency generator wherein an adjustable oscillator works into a frequency counter which, under the control of a timer, determines the instantaneous frequency of the oscillator in order to permit the adjustment thereof to a preselected value.

In frequency generators of the prior art, it has been customary to utilize a multiplicity of decadic stages each controlled (with the exception of the first stage) by an oscillator in the preceding stage and by a timer including a reference oscillator. The object of the present invention is to provide a greatly simplified frequency generator which, apart from the reference oscillator included in the timer, utilizes only a single adjustable oscillator to provide a desired decadic output selectable with great accuracy within a wide frequency range.

This object is realized, pursuant to the present invention, by applying the output of the frequency counter to a comparison circuit which also receives a signal from a presettable frequency selector and, in response to a disparity between said output and said signal, readjusts the operating frequency of the oscillator in a sense reducing such disparity.

The frequency generator may include switch means controlled by the timer for periodically connecting the comparison circuit to a control circuit for the oscillator; between these two circuits there may be inserted a sweep voltage generator designed to vary the operating frequency between certain limits, e.g. over a narrow range corresponding to the smallest unit of the frequency selector or over a wider range between two selected limiting frequencies. In the first instance the sweep voltage generator should have a fixed operating period corresponding to an aliquot part of a timer cycle; in the second case, the frequency selector may comprise two independently settable units for selection of the lower and the upper frequency limit and switchover means for alternately connecting said units to the comparison circuit.

More specifically, the sweep voltage generator may include a source of control voltage with a substantially trapezoidal profile starting from a base level, the comparison circuit being periodically switchable by a timer to vary the base level in response to a signal from one unit and to vary the slope of said profile in response to a signal from the other unit.

The sweep voltage generator could also be a source of continuously varying voltage of reversible slope connected to the comparison circuit for alternate slope reversals in response to a determination of indentity between the output of the frequency counter and a signal from one or the other selector unit, respectively.

In a particularly advantageous embodiment, the comparison circuit includes a coincidence gate and a test circuit, the latter being connected to receive a recurring timing pulse from the timer and a trigger pulse from the coincidence gate, in response to identity of the output of the frequency counter with the signal from the frequency selector, for readjusting the operating frequency of the oscillator in a sense tending to reduce the interval between these two pulses. Thus, depending on whether the trigger pulse leads or lags the timing pulse, a storage condenser forming part of an integrating network may be charged with voltage of one or the other polarity, or an auxiliary frequency counter in a feedback loop of the oscillator may be alternately energized for increasing or decreasing its count.

The invention will be described in greater detail with reference to the accompanying drawing wherein.

Figure 1:
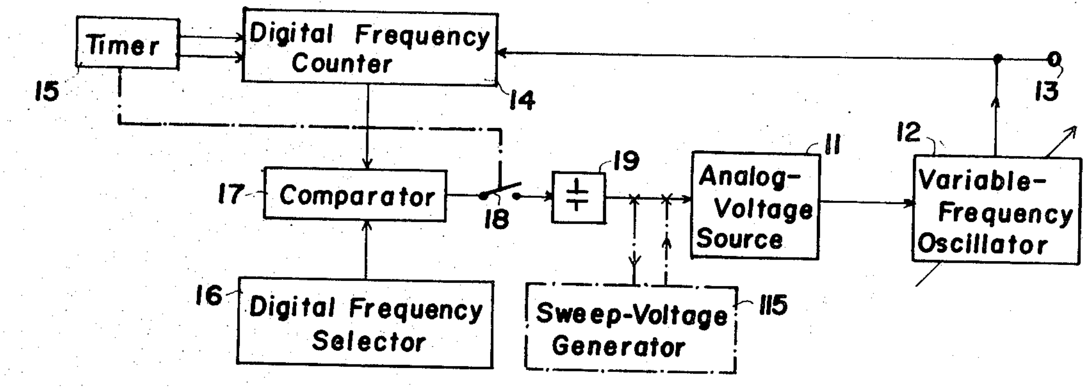
FIG. 1 is block diagram of a circuit arrangement according to my invention designed to control a variable-frequency oscillator.

The system of FIG. 1 comprises a timer 15 controlling a digital frequency counter 14 in the output of an adjustable oscillator 12 which also has a terminal 13 leading to an oscilloscope or other suitable load. The operating frequency of oscillator 12 may be varied by means of a control circuit 11 delivering an analogue voltage of adjustable magnitude. This voltage, in turn, is determined by the charge of a storage condenser 19 whose charging circuit includes a switch 18 in the output of a comparison circuit 17. Switch 18 is periodically opened and closed by the timer 15, its open state coinciding with a measured interval during which the frequency counter 14 is rendered operative. The number of cycles counted during this measured interval is of course, proportional to the operating frequency of oscillator 12.

A manually settable frequency selector 16 works into another input of comparison circuit 17 which, at the end of the measured interval established by the timer 15, determines the existence of any disparity between the output of counter 14 and a signal from digital selector 16. Depending on the size and magnitude of such disparity, the charge of condenser 19 is increased or decreased during the subsequent closure of switch 18 to readjust the operating frequency of oscillator 12 in a sense tending to assimilate the count to the selected frequency, thereby canceling the error signal from circuit 17.

As further shown in FIG. 1, a sweep voltage generator 115 (dot-dash lines) may be inserted between condenser 19 and control circuit 11 to vary the oscillator frequency within a relatively small range about a mean value chosen with the aid of selector 16. The operating period of voltage generator 115 should be an aliquot fraction of a cycle of timer 15 and also of the aforementioned measured interval.

Elements corresponding to those of FIG. 1 have been designated in subsequent FIGS. by similar reference numerals with replacement of the "1" in the first digit by correspondingly higher numbers.

Figure 2:
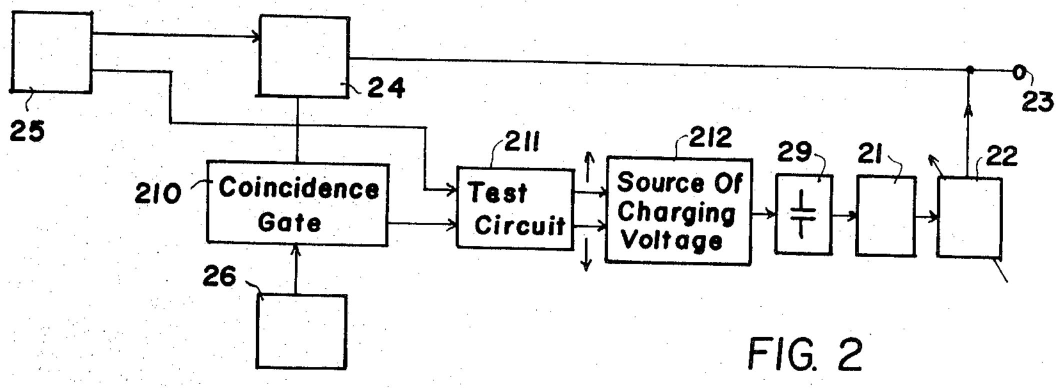
FIG. 2 is a similar block diagram showing a modified control circuit.

FIG. 2 shows an embodiment wherein the comparison circuit 17 of FIG. 1 has been replaced by the combination of a coincidence gate 210 and a test circuit 211 controlling a source of charging voltage 212 for storage condenser 29. Timer 25 emits a periodic starting pulse to initiate an open-ended counting interval of counter 24, this counting interval being terminated by the registration of an identity between the count and the signal from selector 26 in coincidence gate 210. Such an identity generates in the output of this gate a trigger pulse applied to a lower input of test circuit 211 whose upper input receives a timing pulse from timer 25, the timing pulse occurring at predetermined periods after the starting pulse. If the timing pulse precedes the trigger pulse, the operating frequency of oscillator 22 is too low and circuit 211 controls the voltage source 212 in a sense increasing that frequency; if, conversely, the trigger pulse occurs earlier than the timing pulse, the frequency is too high and the test circuit 211 causes an adjustment in the opposite sense.

Figure 3:
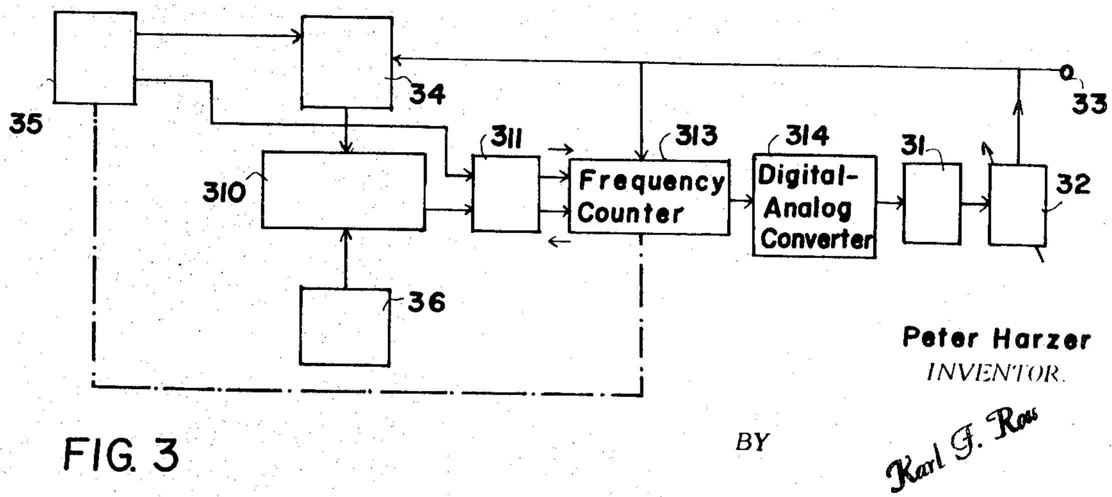
FIG. 3 is another block diagram for an embodiment in which the oscillator has a feedback loop included in the control circuit.

FIG 3 illustrates, in an otherwise identical system, the replacement of voltage source 212 by an auxiliary frequency counter 313 connected in a feedback loop of oscillator 32. Counter 313 has two inputs, selectively energizable by test circuit 311, for either increasing or decreasing its count according to whether an increase or a decrease in the operating frequency of oscillator 32 is desired. The setting of counter 313, which of course is also controlled by the timer 35, gives rise to a digital signal to be translated in a converter 314, into an analogue voltage similar to that produced by source 212 of FIG. 2.

Figure 4:
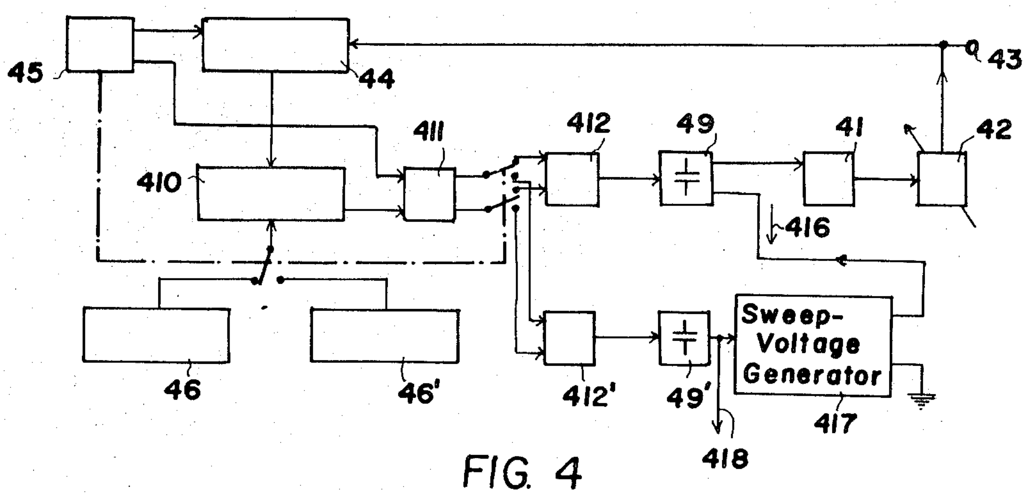
FIG. 4 is a further block diagram with switchover between upper and lower limits of a frequency range.

FIG. 4 shows a system wherein the single frequency selector 16, 26 or 36 of the preceding FIGS. has been replaced by two selector units 46, 46' alternating connectable to the lower input of coincidence gate 410 by a timer-controlled switch; another pairs of such switches alternately apply the error signal from test circuit 411 to a voltage source 412 or a voltage source 412' charging respective storage condensers 49 and 49'. The charge 416 of condenser 49 establishes a base level, e.g. the lower limit, for a periodically varying control voltage applied to circuit 41, this voltage being substantially trapezoidal as a result of the superposition of the output of a variable voltage generator 417 upon the charge of condenser 49. The charge 418 of condenser 49' controls the slope of the output voltage of generator 417 so that, given a fixed interval for the rise and the fall of this voltage, the magnitude of its peak, and therefore the value of the upper limiting frequency of oscillator 42, will be charged in conformity with the setting of selector unit 46'; the lower limiting frequency is determined by the setting of unit 46 through circuits 412 and 49.

Although, for simplicity, the switchover between units 46 and 46' as well as between circuits 412 and 412' is shown to be controlled directly by the timer 45, the arrangement in practice may be such that the timer controls only the voltage generator 417 which in turn completes the connections to components 46 and 412 at its lower voltage plateau and to components 46' and 412' at its upper voltage plateau, all these components being disconnected during the ascending and descending flanks of the voltage sweep.

Figure 5:
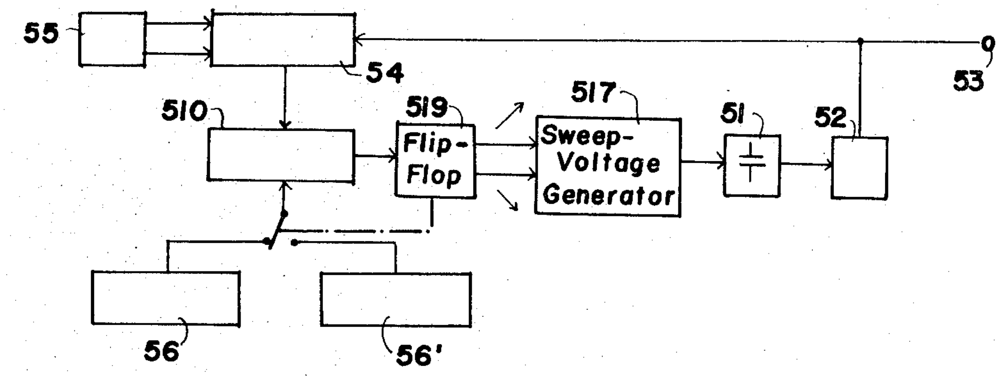
FIG. 5 is a block diagram showing a modification of the embodiment of FIG. 4.

In FIG. 5, finally, there has been shown a sweep voltage generator 517 whose period, in contrast to those of units 115 and 417, may be large compared with a timer cycle and which generates a triangular voltage wave under the control of a flip-flop 519 whose state of conductivity determines the sense of slope of the voltage curve. Selector units 56 and 56' are alternately connectable to coincidence gate 510 by a switch which is controlled by the flip-flop 519 in response to an identity signal from gate 510, the switchover coinciding with a reversal of the slope of voltage source 517. Thus, with unit 56 connected in circuit as shown to establish, say, the lower sweep frequency of oscillator 52, the determination by gate 510 of an identity between the count of element 54 and the signal of unit 56 trips the flip-flop 519 to establish a rising voltage in the output of source 517 and to connect unit 56' in lieu of unit 56, the next reversal occurring upon the registration of an identity between the output of counter 54 and the signal of unit 56' determining the upper frequency limit. As in the system of FIG. 1, timer 55 generates a measured working interval for counter 54; a multiplicity of such intervals occur during each half-cycle of voltage source 517.

I claim:

1. A variable-frequency generator comprising:
an adjustable oscillator;
a frequency counter receiving the output of said oscillator;
a presettable digital frequency selector;
a comparison circuit connected to receive the output of said counter and a signal from said selector;
a control circuit for varying the operating frequency of said oscillator;
a timer with a fixed operating cycle;
switch means responsive to said timer for periodically connecting said comparison circuit to said control circuit for readjusting said operating frequency in a sense reducing any disparity between said output and said signal; and
a sweep voltage generator inserted between said comparison circuit and said control circuit, said sweep voltage generator having a fixed operating period corresponding to an aliquot part of a timer cycle.

2. A variable-frequency generator comprising:
an adjustable oscillator provided with a feedback loop;
a frequency counter receiving the output of said oscillator;
a presettable digital frequency selector;
comparison means connected to receive the outputs of said counter and said selector for generating respective command signals in response to a disparity of either sign between said outputs; and
an auxiliary frequency counter in said feedback loop connected to said comparison means for increasing or decreasing its count, in accordance with the type of command signal generated thereby, to readjust the operating frequency of said oscillator in a sense reducing said disparity.

3. A frequency generator as defined in claim 2, further comprising a timer, said comparison means including a coincidence gate and test circuit, said test circuit being connected to receive a recurring timing pulse from said timer and a trigger pulse from said coincidence gate in response to identity of said outputs, the type of said command signal depending upon the relative order of occurrence of said pulses.

4. A frequency generator as defined in claim 3, further comprising an integrating network energized by said test circuit, said network including a storage condenser and a source of charging voltage therefor, the polarity of said charging voltage depending upon said relative order of occurrence and determining said type of command signal.

5. A variable-frequency generator comprising:
an adjustable oscillator;
a frequency counter receiving the output of said oscillator;
a presettable digital frequency selector including two independently settable units for selection of a lower and an upper frequency limit;
a control circuit for varying the operating frequency of said oscillator;
a timer;
a comparison circuit;
a sweep voltage generator inserted between said comparison circuit and said control circuit; and
switchover means controlled by said timer for alternately connecting said unit to said comparison circuit, the latter further receiving the output of said oscillator and working through said sweep voltage generator into said control circuit for readjusting said operating frequency in a sense reducing any disparity between said output and respective signals from said units.

6. A frequency generator as defined in claim 5 wherein the sweep voltage generator includes a source of control voltage with a substantially trapezoidal profile starting from a variable base level, said comparison circuit being periodically switchable by the timer to vary the base level in response to a signal from one of said units and to vary the slope of said profile in response to a signal from the other of said units.

7. A frequency generator as defined in claim 5 wherein the sweep voltage generator is a source of continuously varying voltage of reversible slope connected to said comparison circuit for alternate slope reversals in response to identity between the outputs of the frequency counter and a signal from one or the other of said units, respectively.